US011489110B2

(12) United States Patent
Wang et al.

(10) Patent No.: US 11,489,110 B2
(45) Date of Patent: Nov. 1, 2022

(54) METHODS FOR TREATING MAGNESIUM OXIDE FILM

(71) Applicant: APPLIED MATERIALS, INC., Santa Clara, CA (US)

(72) Inventors: Xiaodong Wang, San Jose, CA (US);
Renu Whig, Chandler, AZ (US);
Jianxin Lei, Fremont, CA (US);
Rongjun Wang, Dublin, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 236 days.

(21) Appl. No.: 16/845,600

(22) Filed: Apr. 10, 2020

(65) Prior Publication Data
US 2021/0320246 A1 Oct. 14, 2021

(51) Int. Cl.
*H01L 43/12* (2006.01)
*H01L 43/10* (2006.01)
*C23C 14/08* (2006.01)

(52) U.S. Cl.
CPC .............. *H01L 43/12* (2013.01); *C23C 14/08* (2013.01); *C23C 14/081* (2013.01); *H01L 43/10* (2013.01)

(58) Field of Classification Search
CPC ... H01L 43/10; H01L 43/12; C23C 14/00–58; C23C 14/081; C23C 14/564; C23C 14/566
See application file for complete search history.

(56) References Cited

U.S. PATENT DOCUMENTS

| 5,914,018 | A | * | 6/1999 | Fu | .................. C23C 14/3407 204/298.12 |
| 7,239,489 | B2 | | 7/2007 | Lin et al. | |
| 7,488,609 | B1 | | 2/2009 | Lin et al. | |
| 7,751,156 | B2 | | 7/2010 | Mauri et al. | |
| 7,780,820 | B2 | | 8/2010 | Zhao et al. | |
| 8,008,097 | B2 | | 8/2011 | Parkin | |
| 9,293,698 | B2 | | 3/2016 | Whig et al. | |
| 10,439,131 | B2 | * | 10/2019 | Siddik | ............... H01L 43/08 |
| 2009/0324814 | A1 | | 12/2009 | Parkin | |
| 2013/0001189 | A1 | | 1/2013 | Wang et al. | |

(Continued)

FOREIGN PATENT DOCUMENTS

| KR | 20170069345 A | 6/2017 |
| KR | 20170107000 A | 9/2017 |

OTHER PUBLICATIONS

International Search Report and Written Opinion dated Jul. 21, 2021 for Application No. PCT/US2021/025364.

*Primary Examiner* — Davienne N Monbleau
*Assistant Examiner* — Nader M Elmarhoumi
(74) *Attorney, Agent, or Firm* — Moser Taboada

(57) ABSTRACT

A method of forming a tunnel layer of a magnetoresistive random-access memory (MRAM) structure includes forming a first magnesium oxide (MgO) layer by sputtering an MgO target using radio frequency (RF) power, exposing the first MgO layer to oxygen for approximately 5 seconds to approximately 20 seconds at a flow rate of approximately 10 sccm to approximately 15 sccm, and forming a second MgO layer on the first MgO layer by sputtering the MgO target using RF power. The method may be performed after periodic maintenance of a process chamber to increase the tunnel magnetoresistance (TMR) of the tunnel layer.

19 Claims, 3 Drawing Sheets

(56) References Cited

U.S. PATENT DOCUMENTS

2014/0037991 A1\* 2/2014 Abraham ................ H01L 43/08
 428/828.1
2018/0240655 A1\* 8/2018 Wu ......................... H01J 61/10
2019/0123263 A1\* 4/2019 Park ........................ H01L 43/10

\* cited by examiner

METHODS FOR TREATING MAGNESIUM OXIDE FILM

FIELD

Embodiments of the present principles generally relate to manufacturing processes of semiconductor devices.

BACKGROUND

Semiconductor devices are generally fabricated on a substrate as integrated circuits with various conductive layers that are interconnected to one another to facilitate propagation of signals within the device. An example of such a device is a storage element in memories such as magnetoresistive random-access memories (MRAM) that store digital information. An MRAM device is a multi-layered structure that typically includes two sets of magnetic layers separated by a non-magnetic dielectric material. The layers are deposited and then patterned to form the MRAM device. The MRAM device may include a top electrode layer, a free magnetic layer, a tunnel layer, a magnetic stack such as synthetic antiferromagnets or a multilayered magnetic stack, and a bottom electrode. The tunnel layer has a tunnel magnetoresistance (TMR) that allows for control of a tunneling current when the two sets of magnetic layers have a change in alignment (parallel vs antiparallel). TMR is a quantum mechanical effect which can be measured as a ratio (percentage) of resistance change $(R_{antiparallel}-R_{parallel})/(R_{parallel})$. Early on, aluminum oxide-based tunnel barriers were used but were quickly replaced with magnesium oxide (MgO) based tunnel barriers as MgO provided a greater than 10-fold increase in TMR over aluminum oxide.

Today's MRAM manufacturing techniques rely heavily on high percentage TMR values to produce a successful memory storage device. A typical semiconductor chamber may produce thousands of wafers with MRAM devices. The physical vapor deposition (PVD) chambers use sputtering targets to deposit films on the wafers which eventually leads to a build-up of depositions on the process kits in the chambers and also to depletion of the sputtering targets. In general, after every two to ten thousand wafers are processed, a periodic maintenance will be performed on the PVD chamber to replace process kits and to replace sputtering targets. The inventors have observed that some manufacturing processes have greatly decreased TMR values after the chamber periodic maintenance has been performed, leading to nonuniformities and defects of the production of MRAM devices.

Thus, the inventors have provided improved methods to ensure that TMR values are maintained after periodic maintenance of semiconductor process chambers.

SUMMARY

Methods and apparatus for treating magnesium oxide film to improve tunnel magnetoresistance (TMR) are provided herein.

In some embodiments, a method of increasing TMR comprises forming a first magnesium oxide (MgO) layer by sputtering an MgO target using radio frequency (RF) power, exposing the first MgO layer to oxygen, and forming a second MgO layer on the first MgO layer by sputtering the MgO target using RF power.

In some embodiments, the method may further include embodiments where the first MgO layer and the second MgO layer have an approximately equal thickness, the first MgO layer is formed on a magnetic layer of a magnetoresistive random-access memory (MRAM) structure, the first MgO layer and the second MgO layer form a tunnel layer of a magnetoresistive random-access memory (MRAM) structure, the tunnel layer has a TMR value of at least approximately 150% within 0.5 kwh of a process chamber burn-in, exposing the first MgO layer with oxygen for approximately 5 seconds to approximately 20 seconds, the first MgO layer is exposed to oxygen for approximately 10 seconds, performing the method after cleaning or periodic maintenance of a process chamber, exposing the first MgO layer to oxygen with a flow rate of approximately 10 sccm (standard cubic centimeter per minute) to approximately 15 sccm, and/or performing the method after annealing of a magnetoresistive random-access memory (MRAM) structure.

In some embodiments, a method of increasing TMR may comprise replacing at least one sputter target in a multiple cathode process chamber; replacing at least one process kit shield in the multiple cathode process chamber; pasting the multiple cathode process chamber with a first oxygen flow rate that is approximately 10% to approximately 100% higher than a second oxygen flow rate used in forming a metal oxide with a metallic target on interior surfaces of the multiple cathode process chamber, and forming a magnesium oxide (MgO) layer by sputtering an MgO target using radio frequency (RF) power.

In some embodiments, the method may further comprise embodiments where the MgO layer is formed on a magnetic layer of a magnetoresistive random-access memory (MRAM) structure, the MgO layer is a tunnel layer of a magnetoresistive random-access memory (MRAM) structure, the tunnel layer has a TMR value of at least approximately 150% within 0.5 kwh of a process chamber burn-in, and/or the method is performed after cleaning or periodic maintenance of a process chamber.

In some embodiments, a non-transitory, computer readable medium having instructions stored thereon that, when executed, cause a method for increasing TMR to be performed, the method may comprise forming a first magnesium oxide (MgO) layer by sputtering an MgO target using radio frequency (RF) power, exposing the first MgO layer to oxygen for approximately 5 seconds to approximately 20 seconds at a flow rate of approximately 10 sccm to approximately 15 sccm, and forming a second MgO layer on the first MgO layer by sputtering the MgO target using RF power.

In some embodiments, the non-transitory, computer readable medium having instructions stored thereon that, when executed, cause a method for increasing TMR to be performed that may further include wherein the first MgO layer and the second MgO layer form a tunnel layer of a magnetoresistive random-access memory (MRAM) structure, wherein the tunnel layer has a TMR value of at least approximately 150% within 0.5 kwh of a process chamber burn-in, performing the method after cleaning or periodic maintenance of a process chamber, and/or wherein the first MgO layer is exposed to oxygen for approximately 10 seconds.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
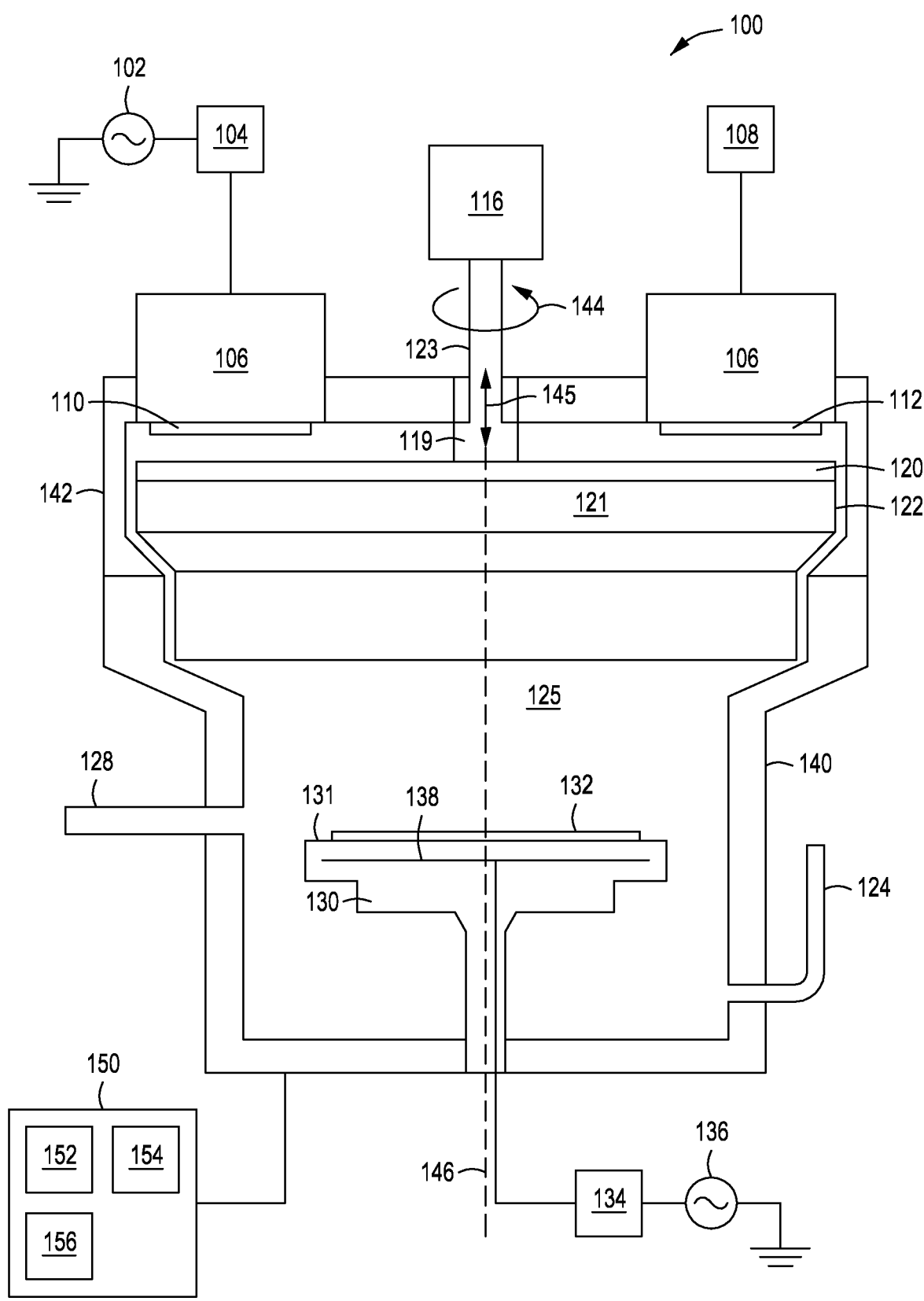
FIG. 1 depicts a cross-sectional schematic side view of a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for magnetoresistive random-access memory (MRAM) structures leverage oxygen treatments to improve tunnel magnetoresistive (TMR) values of tunnel layers. The inventors have found that events like cleaning and periodic maintenance procedures for physical vapor deposition (PVD) chambers, along with other factors (such as, e.g., MRAM stack annealing, different material layers in MRAM stack), may cause an oxygen deficiency in the tunnel layer that lowers the TMR of the tunnel layer by as much as 30% to 40%. Oxygen treatments of the tunnel layer facilitate in recovery of TMR after the events much faster than pasting and burn-in procedures alone. Oxygen treatment of a tunnel layer material such as magnesium oxide (MgO) during formation may increase the TMR value more than is achievable without treatment. Oxygen treatment of the PVD chamber during pasting, prior to the MgO formation, may recover the TMR value to pre-event levels. The oxygen treatments provided by the methods of the present principles are also applicable to other situations and chamber types.

For the sake of brevity, an example chamber type and an MgO tunnel layer of an MRAM structure will be discussed but is not meant to be limiting in any way. In some embodiments, a multiple cathode PVD chamber (e.g., process chamber 100, FIG. 1) may be used to perform the methods of the present principles. The process chamber 100 may include a plurality of cathodes 106 having a corresponding plurality of targets (dielectric targets 110 and/or metallic targets 112), attached to a chamber body 140 (for example, via a top adapter assembly 142). In some embodiments, the RF and DC cathodes are alternated in the top adapter assembly 142. In other embodiments, an RF cathode can be adjacent to other RF cathodes and likewise for DC cathodes. When multiple RF cathodes are used, the operating frequencies may be offset to reduce any interference during deposition processes. For example, in a three RF cathode configuration, the first RF cathode may be operated at a frequency of 13.56 MHz, the second RF cathode is operated at a frequency of 13.66 MHz (+100 kHz), and the third RF cathode is operated at a frequency of 13.46 MHz (−100 kHz). The offset is not required to be +/−100 kHz. The offset can be chosen based on crosstalk prevention for a given number of cathodes.

An RF cathode is typically used with the dielectric target 110 for dielectric film deposition on a wafer. A DC cathode is typically used with the metallic target 112 for pasting after the dielectric film deposition on the wafer. The pasting reduces the chance of particle formation and defects in the deposition film. Having a process chamber with RF and DC cathodes allows for faster production of wafers because the pasting and dielectric deposition can be done in one chamber. In addition, having multiple cathodes of the same type, allows for greater pasting and deposition rates. A greater deposition rate means that a wafer spends less time in the chamber to achieve a certain film thickness. The reduced time in the chamber or dwell time reduction results in fewer wafer defects. In some embodiments, the metallic target 112 may be formed of a metal such as, for example, tantalum, aluminum, titanium, molybdenum, tungsten, and/or magnesium. The dielectric target 110 may be formed of a metal oxide such as, for example, magnesium oxide, titanium oxide, titanium magnesium oxide, and/or tantalum magnesium oxide. Other metals and/or metal oxides may be used. The sputter targets have a given life span and may be replaced during periodic maintenance.

The process chamber 100 also includes a substrate support 130 to support a substrate 132. The process chamber 100 includes an opening (not shown) (e.g., a slit valve) through which an end effector (not shown) may extend to place the substrate 132 onto lift pins (not shown) for lowering the substrate 132 onto a support surface 131 of the substrate support 130. In some embodiments as shown in FIG. 1, the targets 110, 112 are disposed substantially parallel with respect to the support surface 131. The substrate support 130 includes a biasing source 136 coupled to a bias electrode 138 disposed in the substrate support 130 via a matching network 134. The top adapter assembly 142 is coupled to an upper portion of the chamber body 140 of the process chamber 100 and is grounded. A cathode 106 can have a DC power source 108 or an RF power source 102 and an associated magnetron. In the case of the RF power source 102, the RF power source 102 is coupled to a cathode 106 via an RF matching network 104.

A shield 121 is rotatably coupled to the top adapter assembly 142 and is shared by the cathodes 106. In some embodiments, the shield 121 includes a shield body 122 and a shield top 120. In some embodiments, the shield 121 has aspects of the shield body 122 and the shield top 120 integrated into one unitary piece. In some embodiments, the shield 121 can be more than two pieces. Depending on the number of targets that need to be sputtered at the same time, the shield 121 can have one or more holes to expose a corresponding one or more targets. The shield 121 advantageously limits or eliminates cross-contamination between the plurality of targets 110,112. The shield 121 is rotationally coupled to the top adapter assembly 142 via a shaft 123. The shaft 123 is attached to the shield 121 via a coupler 119. Additionally, since the shield 121 is rotatable, areas of the shield 121 that would not normally receive pasting are moved such that the areas can now be pasted, significantly reducing flaking of built-up deposition and particle formation. One or more shields may form a process kit. The process kit may be replaced at periodic intervals due to deposition build-up.

An actuator 116 is coupled to the shaft 123 opposite the shield 121. The actuator 116 is configured to rotate the shield 121, as indicated by arrow 144, and move the shield 121 up and down in the vertical direction along the central axis 146 of the process chamber 100, as indicated by arrow 145. During processing, the shield 121 is raised to an upward position. The raised position of the shield 121 exposes targets used during a processing step and also shields targets not used during the processing step. The raised position also grounds the shield for RF processing steps. The process chamber 100 further includes a process gas supply 128 to supply a process gas to an internal volume 125 of the process chamber 100. The process chamber 100 may also include an exhaust pump 124 fluidly coupled to the internal volume 125 to exhaust the process gas from the process chamber 100. In some embodiments, for example, the process gas supply 128 may supply oxygen and/or inert gas to the internal volume 125.

A controller 150 generally includes a Central Processing Unit (CPU) 152, a memory 154, and a support circuit 156. The CPU 152 may be any form of a general-purpose computer processor that can be used in an industrial setting. The support circuit 156 is conventionally coupled to the CPU 152 and may comprise a cache, clock circuits, input/output subsystems, power supplies, and the like. Software routines, such as a method as described above may be stored in the memory 154 and, when executed by the CPU 152, transform the CPU 152 into a specific purpose computer (controller 150). The software routines may also be stored and/or executed by a second controller (not shown) that is located remotely from the process chamber 100.

The memory 154 is in the form of computer-readable storage media that contains instructions, when executed by the CPU 152, to facilitate the operation of the semiconductor processes and equipment. The instructions in the memory 154 are in the form of a program product such as a program that implements the apparatus of the present principles. The program code may conform to any one of a number of different programming languages. In one example, the disclosure may be implemented as a program product stored on a computer-readable storage media for use with a computer system. The program(s) of the program product define functions of the aspects. Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the substrate heating system described herein, are aspects of the present principles.

Figure 2:
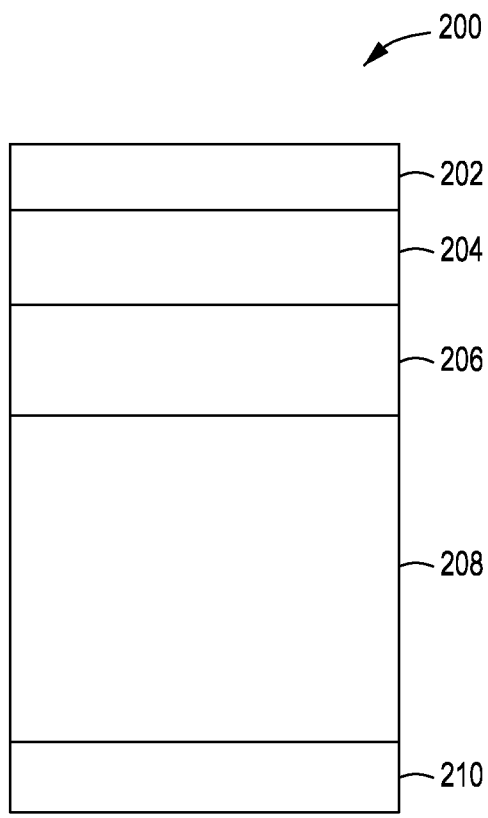
FIG. 2 depicts a cross-sectional view of an MRAM stack in accordance with some embodiments of the present principles.

FIG. 2 is a cross-section of an MRAM stack 200 in accordance with an embodiment. The MRAM stack 200 has a lower electrode 210, a first magnetic layer 208, a tunnel layer 206, a second magnetic layer 204, and an upper electrode 202. The inventors have observed that different manufacturing techniques of the MRAM stack may lead to lowered TMR of the tunnel layer 206 after periodic maintenance is performed on the process chamber such as, but not limited to, a PVD chamber (see, e.g., FIG. 1). The periodic maintenance generally includes replacing sputter targets and/or process kits or shields in the process chamber after a given number of wafers (e.g., after 2000 to 10000 wafers) are processed. During a wafer run, the sputter targets erode, and the process kits have deposition build-up.

After maintenance is performed on the process chamber, a burn-in process is performed that may include sputtering of targets and pasting of materials onto the chamber process volume and/or process kits before more wafers are processed. The burn-in process normalizes the process chamber by burning in the new sputter targets and pasting a film on the process chamber walls/process kits. In a multiple cathode process chamber the metal targets and metal oxide targets may both be burned in. Process chamber runtime is based on the number of kilowatt-hours the process chamber has been operating. With some types of MRAM stacks, the tunnel layers may be produced with high TMR values after as little as approximately 0.5 kwh of burn-in. The inventors have found that other types of MRAM stacks require 7 kwh to 15 kwh or more of burn-in before the TMR values returned to the pre-maintenance levels. The inventors discovered that the slow recovery of TMR was due to a change in magnesium-to-oxygen ratio of the deposited MgO tunnel layer of the MRAM stacks. MRAM stack formation methods that resulted in a higher magnesium-to-oxygen ratios required a much longer burn-in period to recover pre-maintenance TMR values (e.g., 8 kwh to 10 kwh or more). Certain annealing techniques and other factors such as, for example, layers of material that may deplete a process chamber of available oxygen may also contribute to the ratio change.

A magnesium-to-oxygen ratio change of 3% or less may cause up to a 40% decrease in TMR. The decrease in TMR is not acceptable when the MRAM stack is TMR sensitive. The added burn-in time to recover back to the pre-maintenance TMR delays production and reduces the lifetime of the sputter targets and/or the process kits/shields, increasing production costs. The inventors observed that treating the MgO deposition with oxygen after formation of the MgO tunnel layer caused an undesirable increase in burn-in time before TMR values recovered to the pre-maintenance levels. The inventors also observed that the RA (resistance×area) of the MgO layer also increased using a post deposition oxygen treatment. The TMR of the MgO tunnel layer actually recovered faster without an after-deposition oxygen treatment. After much effort, the inventors discovered that TMR values could be recovered faster with an interim oxygen treatment or a pre-formation oxygen treatment. The interim oxygen treatment produced higher than pre-maintenance TMR values.

Figure 3:
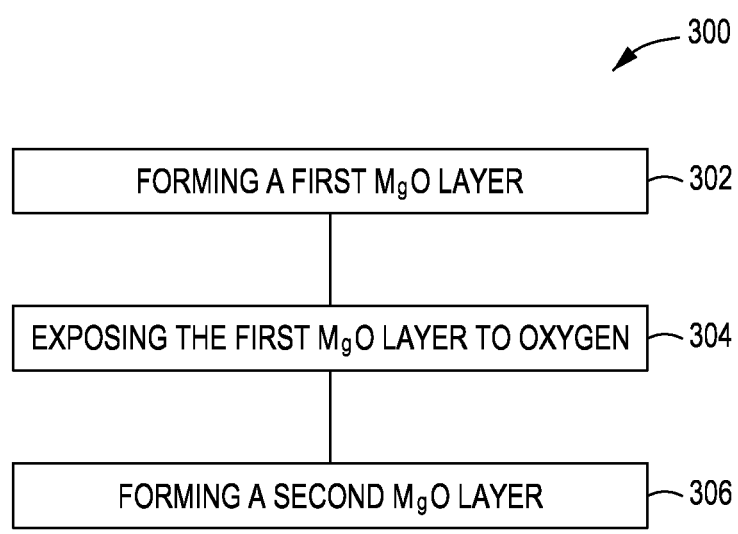
FIG. 3 is a method of forming a magnesium oxide layer in accordance with some embodiments of the present principles.

FIG. 3 is a method 300 of forming a magnesium oxide layer in accordance with some embodiments. During an MgO deposition process using RF power, an MgO target is sputtered to directly deposit an MgO layer on a substrate. The MgO target is chemically stable and does not allow the addition of more oxygen during the sputtering of the MgO target (unlike formation of an MgO film by a magnesium target using DC power while oxygen is flowed into the process chamber). In block 302, a first MgO layer is formed on a wafer. The MgO is deposited onto, for example, a first magnetic layer of an MRAM stack using an RF power source in a PVD chamber. In some embodiments, the first MgO layer comprises approximately half of a total thickness of a tunnel layer of an MRAM stack. In some embodiments, the deposition process takes approximately 20 seconds to form the first MgO layer. In block 304, the first MgO layer is then exposed to oxygen within the process chamber. In some embodiments, the first MgO layer is exposed to oxygen for between approximately 5 seconds to approximately 20 seconds. In some embodiments, the first MgO layer is exposed to oxygen for approximately 10 seconds. In some embodiments, the oxygen flow rate in the process chamber is approximately 5 sccm (standard cubic centimeter per minute) to approximately 20 sccm. In some embodiments, the oxygen flow rate in the process chamber is approximately 10 sccm to approximately 15 sccm. In block 306, a second MgO layer is formed on a wafer. The MgO is deposited onto the first magnetic layer of the MRAM stack using an RF power source in the PVD chamber. In some embodiments, the second MgO layer comprises approximately half of the total thickness of the tunnel layer of the MRAM stack. In some embodiments, the deposition process takes approximately 20 seconds to form the second MgO layer. Interim treatment of the MgO tunnel layer with oxygen increases the TMR when compared to pre-maintenance TMR levels. In some embodiments, the tunnel layer will achieve a TMR of at least 150% within 0.5 kwh of process chamber burn-in.

Figure 4:
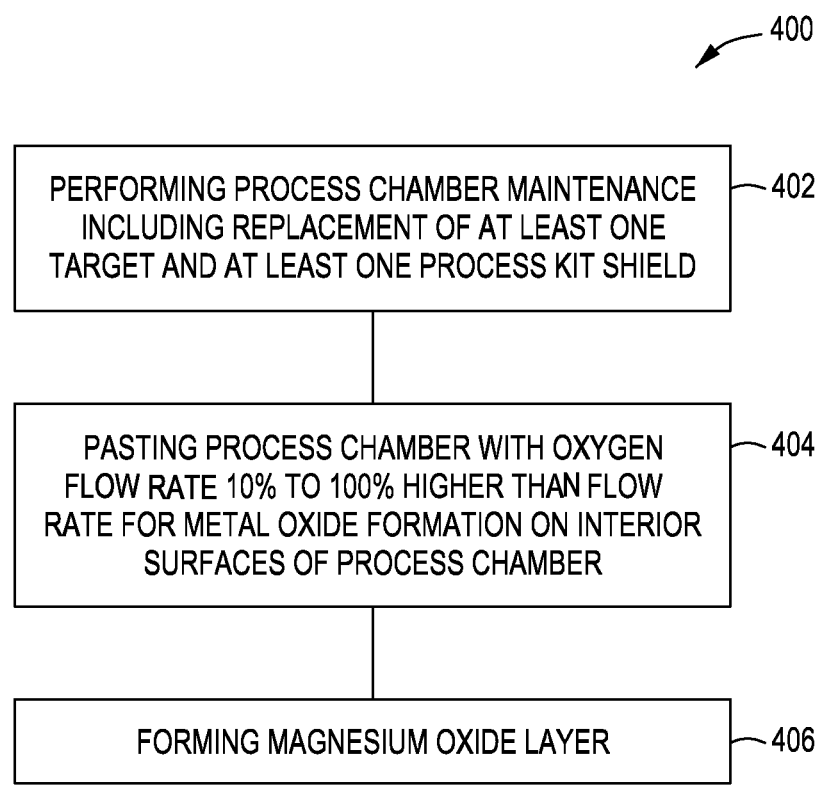
FIG. 4 is a method of forming a magnesium oxide layer in accordance with some embodiments of the present principles.

In some production circumstances, using a two-step process for the formation of the MgO tunnel layer in an MRAM stack may not be optimal. FIG. 4 is a method 400 of forming a magnesium oxide layer in accordance with some embodiments. In block 402, a process chamber maintenance is performed that includes replacing at least one target and at least one process kit shield. The process chamber maintenance is typically performed as part of a periodic maintenance procedure after a certain number of wafers have been run and/or after a certain number of kilowatt-hours have passed. In block 404, the process chamber is pasted with a first oxygen flow rate that is approximately 10% to approximately 100% higher than a second oxygen flow rate for forming a metal oxide on interior surfaces of the process chamber. The pasting is done as part of the process chamber burn-in after the process chamber maintenance is completed. Metallic targets are sputtered using DC power in an oxygen environment to form a metal oxide film on the interior surfaces of the process chamber. The second oxygen flow rate is set to allow the sputtered metal to form as a dielectric on the process chamber surfaces. In some embodiments, the first oxygen flow rate in the process chamber is approximately 5 sccm to approximately 20 sccm. In some embodiments, the first oxygen flow rate in the process chamber is approximately 10 sccm to approximately 15 sccm. In some embodiments, the first oxygen flow rate is approximately 15 sccm. The pre-formation oxygen treatment flow rate (first oxygen flow rate) represents an increase over an oxygen flow rate (second oxygen flow rate) used for pasting of the process chamber (e.g., less than 5 sccm oxygen flow rate). For pasting purposes, the oxygen is typically flowed in conjunction with an inert gas such as, for example, argon. In general, the inert gas flow rate is approximately 10 sccm for pasting. The goal of the extra oxygen (first oxygen rate) is to provide treatment of the process chamber prior to the deposition of an MgO layer. Too little oxygen or too much oxygen and the treatment will have little effect on the TMR. The extra oxygen introduced into the chamber should be enough to overcome any oxygen depletion present in the process chamber. In block 406, a magnesium oxide layer is formed. In some embodiments, the MgO layer will achieve a TMR of at least 150% within 0.5 kwh of process chamber burn-in.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of increasing tunnel magnetoresistance (TMR), comprising:
    forming a first magnesium oxide (MgO) layer by sputtering an MgO target using radio frequency (RF) power;
    exposing the first MgO layer to oxygen with a flow rate of approximately 10 sccm (standard cubic centimeter per minute) to approximately 15 sccm; and
    forming a second MgO layer on the first MgO layer by sputtering the MgO target using RF power.

2. The method of claim 1, wherein the first MgO layer and the second MgO layer have an approximately equal thickness.

3. The method of claim 1, wherein the first MgO layer is formed on a magnetic layer of a magnetoresistive random-access memory (MRAM) structure.

4. The method of claim 1, wherein the first MgO layer and the second MgO layer form a tunnel layer of a magnetoresistive random-access memory (MRAM) structure.

5. The method of claim 4, wherein the tunnel layer has a TMR value of at least approximately 150% within 0.5 kWh of a process chamber burn-in.

6. The method of claim 1, further comprising:
    exposing the first MgO layer with oxygen for approximately 5 seconds to approximately 20 seconds.

7. The method of claim 1, wherein the first MgO layer is exposed to oxygen for approximately 10 seconds.

8. The method of claim 1, further comprising:
    performing the method of claim 1 after cleaning or periodic maintenance of a process chamber.

9. The method of claim 1, further comprising:
    performing the method of claim 1 after an annealing of a previous magnetoresistive random-access memory (MRAM) structure in a process chamber.

10. A method of increasing tunnel magnetoresistance (TMR), comprising:
    replacing at least one sputter target in a multiple cathode process chamber;
    replacing at least one process kit shield in the multiple cathode process chamber;
    pasting the multiple cathode process chamber to form a metal oxide layer on interior surfaces of the multiple cathode process chamber using an oxygen flow rate that is approximately 10% to approximately 100% higher than a flow rate needed to form metal oxide; and
    forming a magnesium oxide (MgO) layer by sputtering an MgO target using radio frequency (RF) power after pasting the metal oxide layer on the interior surfaces of the multiple cathode process chamber.

11. The method of claim 10, wherein the MgO layer is formed on a magnetic layer of a magnetoresistive random-access memory (MRAM) structure.

12. The method of claim 10, wherein the MgO layer is a tunnel layer of a magnetoresistive random-access memory (MRAM) structure.

13. The method of claim 12, wherein the tunnel layer has a TMR value of at least approximately 150% within 0.5 kWh of a process chamber burn-in.

14. The method of claim 10, further comprising:
   performing the method of claim 10 after cleaning or periodic maintenance of the multiple cathode process chamber.

15. A non-transitory, computer readable medium having instructions stored thereon that, when executed, cause a method for increasing tunnel magnetoresistance (TMR) to be performed, the method comprising:
   forming a first magnesium oxide (MgO) layer by sputtering an MgO target using radio frequency (RF) power;
   exposing the first MgO layer to oxygen for approximately 5 seconds to approximately 20 seconds at a flow rate of approximately 10 sccm to approximately 15 sccm; and
   forming a second MgO layer on the first MgO layer by sputtering the MgO target using RF power.

16. The non-transitory, computer readable medium of claim 15, wherein the first MgO layer and the second MgO layer form a tunnel layer of a magnetoresistive random-access memory (MRAM) structure.

17. The non-transitory, computer readable medium of claim 16, wherein the tunnel layer has a TMR value of at least approximately 150% within 0.5 kWh of a process chamber burn-in.

18. The non-transitory, computer readable medium of claim 15, further comprising:
   performing the method of claim 15 after cleaning or periodic maintenance of a process chamber.

19. The non-transitory, computer readable medium of claim 15, wherein the first MgO layer is exposed to oxygen for approximately 10 seconds.

\* \* \* \* \*